(12) United States Patent
Kameda et al.

(10) Patent No.: US 6,501,410 B1
(45) Date of Patent: Dec. 31, 2002

(54) SIGNAL ANALYZING APPARATUS

(75) Inventors: Keiji Kameda, Atsugi (JP); Toshiyuki Matsuda, Koriyama (JP); Yoshihiko Honda, Koriyama (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/713,953

(22) Filed: Nov. 16, 2000

(30) Foreign Application Priority Data

Nov. 19, 1999 (JP) ............................................. 11-330650

(51) Int. Cl.[7] ................................................ H03M 1/12
(52) U.S. Cl. ........................ 341/155; 375/298; 375/324; 375/355
(58) Field of Search ................................. 341/143, 123, 341/155, 112, 159, 157, 118, 120; 375/324, 316, 362, 261, 298, 303, 355; 327/254, 238, 113, 116

(56) References Cited

U.S. PATENT DOCUMENTS

| 5,600,675 | A | * | 2/1997 | Engeler ........................ 375/261 |
| 5,621,345 | A | * | 4/1997 | Lee et al. ..................... 327/254 |
| 5,784,414 | A | * | 7/1998 | Bruekers et al. ............. 375/324 |
| 6,191,718 | B1 | * | 2/2001 | Matsumoto .................. 341/143 |

OTHER PUBLICATIONS

Data sheets of Harris Semiconductor "HSP 45116" issued Aug., 1992, pp. 171–186.

* cited by examiner

Primary Examiner—Brian Young
Assistant Examiner—John Nguyen
(74) Attorney, Agent, or Firm—Frishauf, Holtz, Goodman, Langer & Chick, P.C.

(57) ABSTRACT

An A/D converter converts a to-be-measured analog signal to digital data while being sampled with a predetermined sampling frequency. A data sorting circuit sorts the digital data which is outputted from the A/D converter alternately into two signal paths and outputs them in parallel form at a ½ sampling frequency rate.

14 Claims, 6 Drawing Sheets

SIGNAL ANALYZING APPARATUS

CROSS-REFERENCE TO RELATED APPLICATION

This application is based upon claims the benefit of priority from the prior Japanese Patent Application No. 11-330650 filed Nov. 19, 1999, the entire contents of which are incorporated herein by reference.

BACKGROUND OF THE INVENTION

The present invention relates to a signal analyzing apparatus and, in particular, a signal analyzing apparatus adopting the technique for analyzing various kinds analog signals having different band center frequencies and band widths.

In a mobile communications system, for example, a local signal is quadrature modulated with digital data and an obtained digital modulation signal is transmitted and received.

In order to evaluate the apparatus of such a mobile communications system, various analyses are sometimes made on the digital modulation signals of an intermediate frequency band.

FIG. 9 is a block diagram showing a schematic arrangement of a prior art signal analyzing apparatus used in the analysis of a digital modulation signal, etc., of the intermediate frequency band.

In the signal analyzing apparatus 10, first, an input analog signal as an object to be analyzed is converted by an A/D converter 11 to digital data D while being sampled with a sampling signal CKs of a predetermined frequency Fs.

Then the base band components I, Q of the digital data are found by a baseband detection section 12.

Calculation processing is performed by a calculation processing section 13 on the baseband components I, Q to find the characteristic values of the input signal 12.

In the baseband detection section 12, a frequency shift circuit 12a multiplies the digital data D by a local signal of a frequency equal to the band center frequency Fc of the analog signal S to calculate two quadrature signals.

In the baseband detection section 12, digital filters 12b, 12c perform bandpass limitation processing on these quadrature signals and, by doing so, the baseband components I, Q are detected.

In the signal analyzing apparatus thus structured, in order to analyze various signals of different band widths and band centers, it is necessary to use an A/D converter 11 having its operation speed (sampling frequency) correspond to a maximal band width and a baseband detection section 12 having its operation speed correspond thereto.

In recent years, there appears, as a W-CDMA system, a communications system using a digital modulation signal having a band as broad as over 20 MHz.

In order to analyze the signal of such a broadband, it is necessary to use the operation speed of over 40 MHz.

At a present time, as the A/D converter, there has been realized an A/D converter having an operation speed of over 40 MHz.

However, it has been very difficult to realize a baseband detection section for allowing multiplying processing and filtering processing to be performed on digital data outputted from a high-speed A/D converter and for allowing its local frequency and filter factor to freely vary in a broader range.

For this reason it has not been possible to effectively utilize the high-speed characteristic of the A/D converter and to make accurate analysis on digital modulation signals of the W-CDMA system, etc.

BRIEF SUMMARY OF THE INVENTION

It is accordingly the object of the present invention to provide a signal analyzing apparatus which solves the above-mentioned problem and can analyze various kinds of analog signals of different band widths and band centers including a broadband signal such as a digital modulation signal of a W-CDMA system and can do so without sacrificing a high-speed characteristic of the A/D converter.

In order to achieve the above-mentioned object, according to one aspect of the present invention, there is provided a signal analyzing apparatus comprising an analog/digital (A/D) converter (21) for converting a to-be-measured analog signal to digital data while being sampled with a predetermined sampling frequency; a data sorting circuit (22) for sorting the digital data which is outputted from the A/D converter alternately into two signal paths and outputting two digital data each having a ½ rate of the sampling frequency in parallel form; a first frequency shift circuit (30) for multiplying the two digital data which are outputted in parallel form from the data sorting circuit by a first local signal whose local frequency is set to ¼ of the sampling frequency to shift a band center frequency of the digital data signal by ¼ of the sampling frequency toward a lowband side and generating corresponding two quadrature signals; two ½ decimating circuits (31, 32) for receiving the two quadrature signals outputted from the first frequency shift circuit, performing band limitation processing with ¼ of the sampling frequency as an upper limit and generating two quadrature signals whose rates are reduced to ½ relative to input signals; a second frequency shift circuit (33) for multiplying the two quadrature signals which are outputted from the two ½ decimating circuit by a second local signal of a pre-set local frequency to shift the band center frequency to a lowband side and outputting corresponding two quadrature signals with the band center frequency set to zero; a controller (40) for setting the second local frequency so as to obtain baseband components of the to-be-measured analog signal as outputs from the second frequency shift circuit; and calculating means (37) for calculating characteristic values of the to-be-measured analog signal by performing calculation processing on the baseband components on the basis from the outputs from the second frequency shift circuit.

According to another aspect of the present invention, there is provided a signal analyzing apparatus, comprising an A/D converter (21) for converting a to-be-measured analog signal to digital data while being sampled with a predetermined sampling frequency; a data sorting apparatus (22) for sorting the digital data which is outputted from the A/D converter alternately into two signal paths and outputting two digital data each having a ½ rate of the sampling frequency; a first frequency shift circuit (30) for multiplying the two digital data which are outputted in parallel form from the data sorting circuit by a first local signal of a local frequency set to zero to shift the band center frequencies of the two digital data to zero and generating corresponding two quadrature signals; two ½ decimating circuits (31, 32) for receiving the two quadrature signals outputted from the first frequency shift circuit, performing band limitation processing with ¼ of the sampling frequency as an upper limit and generating two quadrature signals whose rates are reduced to ½ relative to input signals; a second frequency shift circuit (33) for multiplying the two quadrature signals which are outputted from the two ½ decimating circuits by a second local signal of a pre-set local frequency to shift the band center frequency toward a lowband side and generating corresponding two quadrature signals whose band center frequencies are set to zero; a controller (40) for setting the local frequencies of the first local signal and second local signal so as to obtain baseband components as outputs from the second frequency shift circuit; and calculating means (37) for calculating characteristic values of the to-be-measured analog signal by performing calculation processing on the baseband components on the basis of the outputs from the second frequency shift circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

DETAILED DESCRIPTION OF THE INVENTION

Figure 1:
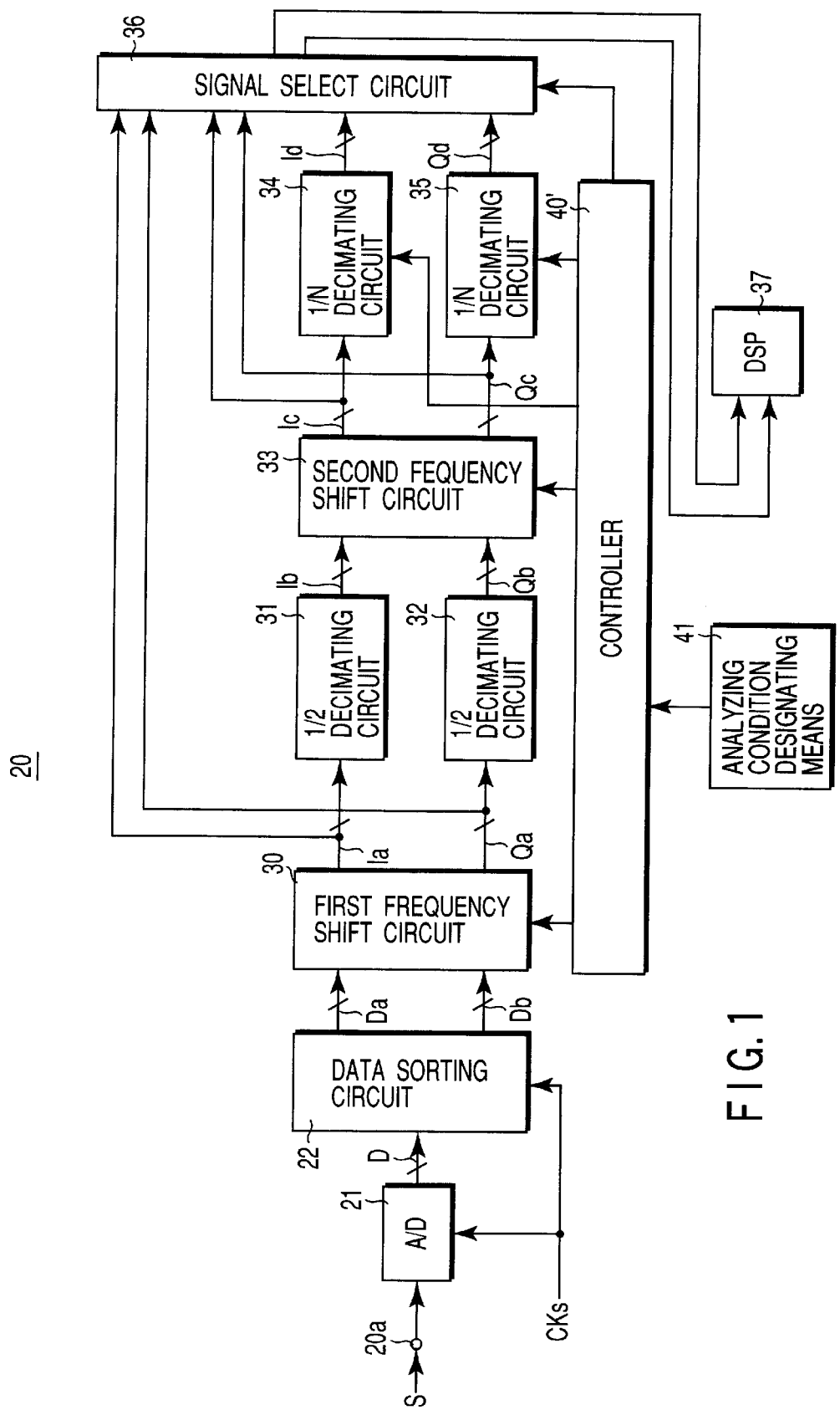
FIG. 1 is a block diagram showing an arrangement of a signal analyzing apparatus according to one embodiment of the present invention.

Reference will now be made in detail to the presently preferred embodiments of the invention as illustrated in the accompanying drawings, in which like reference numerals designate like or corresponding parts.

The embodiments of the present invention will be explained below with reference to the accompanying drawings.

FIG. 1 shows an arrangement of a signal analyzing apparatus 20 applied to the present invention.

An analog signal S is inputted to an input terminal 20a of the signal analyzing apparatus 20 and then to an A/D converter 21 where, by being sampled in synchronism with a sampling signal CKs of a predetermined frequency Fs, it is converted to a digital signal.

It is to be noted that, in order to analyze an analog signal of a high frequency band, a frequency convention circuit is sometimes provided between the input terminal 20a and the A/D converter 21.

The A/D converter 21 has an operation speed of over two times the band width (20 MHz), for example, 64 MHz, of a digital modulation signal of a W-CDMA system and, here, operates with the sampling signal CKs of 64 MHz.

The digital data D outputted from the A/D converter 21 is inputted to a data sorting circuit 22.

The data sorting circuit 22 sorts the digital data which is outputted from the A/D converter 21 alternately into two signal paths in synchronism with a sampling signal CKs and parallel-outputted in an in-phase state at a ½ rate of the sampling frequency Fs.

Figure 2:
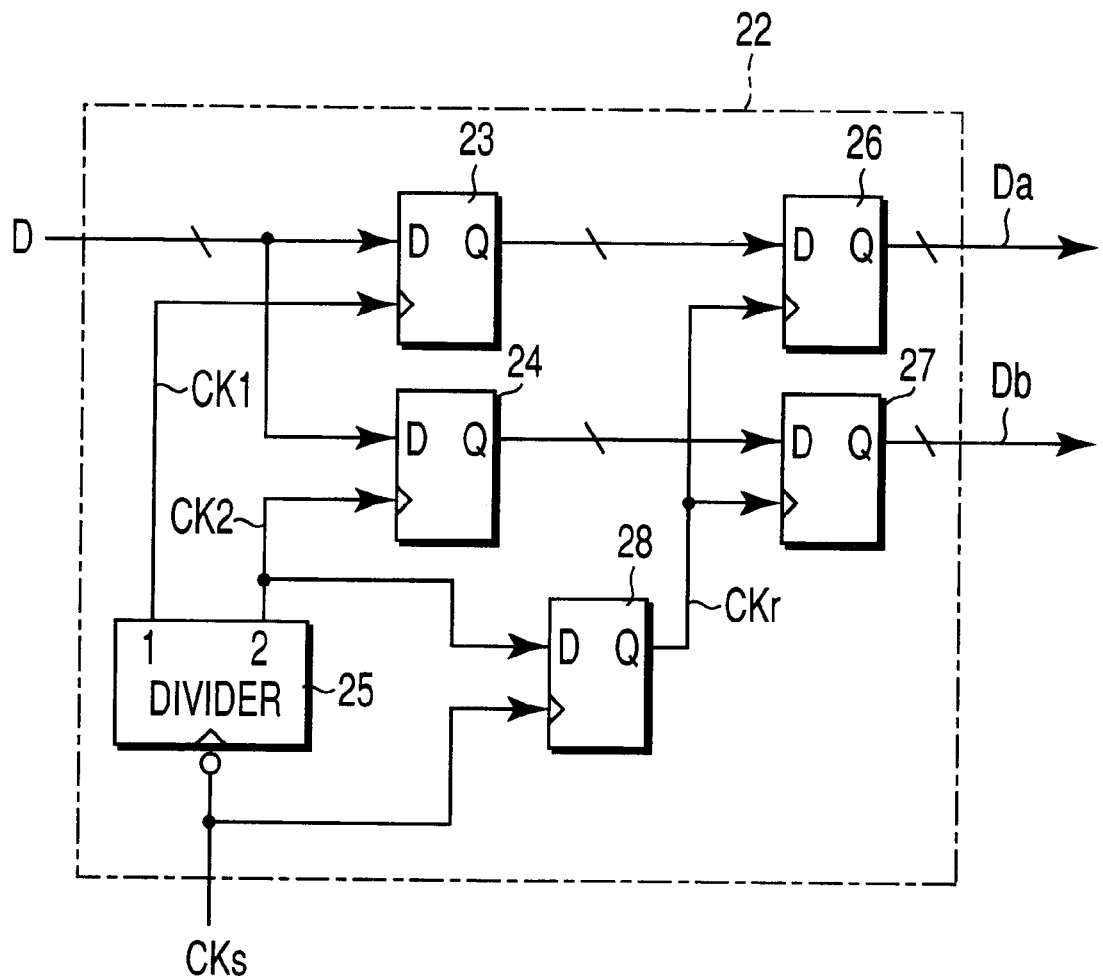
FIG. 2 is a schematic view showing a major section of the embodiment shown in FIG. 1.

The data sorting circuit 22 sends the digital data which is outputted from the A/D converter 21 to two latch circuits 23, 24, as shown in FIG. 2, while allowing two frequency division signals CK1, CK2 which have their leading edge's phases mutually inverted in synchronism with a trailing edge of the sampling signal CKs to be applied to the latch circuits 23, 24, and allows the digital data to be latched, noting that the frequency division signals are obtained by dividing the sampling signal CKs by means of a frequency divider 25.

The latch outputs from the latch circuits 23, 24 are inputted to latch circuits 26 and 27.

A common clock signal CKr from a latch circuit 28 is inputted to the latch circuits 26 and 27.

The latch circuit 28 latches the frequency division signal CK2 by the loading edge of the sampling signal CKs and generates the common clock signal CKr which is obtained by delaying the frequency division signal CK2 by one half the period Ts of the sampling signal CKs.

Figure 3A:
FIGS. 3A to 3I shows a timing chart for explaining an operation of the major section of the embodiment shown in FIG. 1.
Figure 3B:
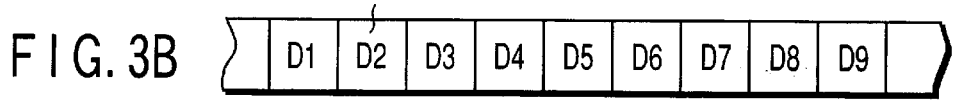
Figure 3C:
Figure 3D:
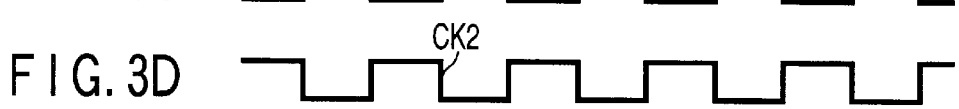

When digital data D1, D2, D3, . . . as shown in FIG. 3B are outputted from the A/D converter 21 in synchronism with the leading edges of the sampling signal CKs shown in FIG. 3A, the data sorting circuit 22 thus arranged allows the two frequency division signals CK1, CK2 which rise in synchronism with the trailing edges of the sampling signal CKs as shown in FIGS. 3C and 3D to be inputted to the latch circuits 23, 24.

Figure 3E:
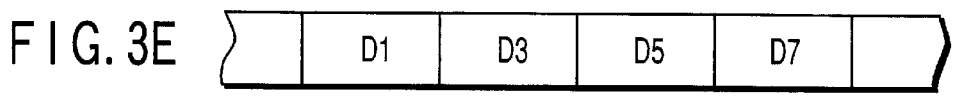

Here, from one latch circuit 23, digital data D1, D3, D5, . . . are outputted as shown in FIG. 3E.

Figure 3F:
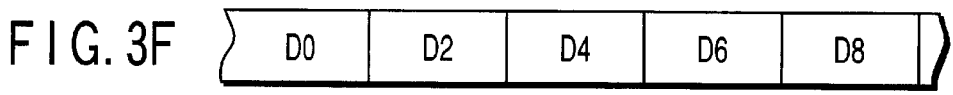

From the other latch circuit 24, digital data b2, D4, Dq, . . . shifted by one period of the sampling signal CKs relative to the digital data D1, D3, D5, . . . as shown in FIG. 3F are outputted.

Figure 3G:
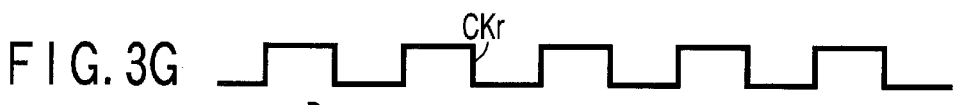
Figure 3H:
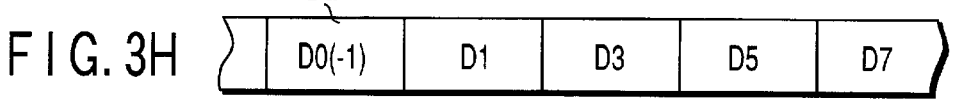
Figure 3I:
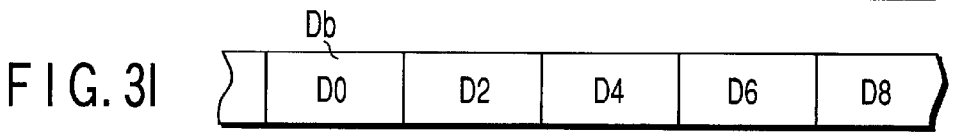

These digital data are inputted to the latch circuits 26, 27 and, on the other hand, the common clock signal CKr delayed by Ts/2 behind the frequency signal CK2 as shown in FIG. 3G is inputted from the latch circuit 28 and, from the latch circuits 26, 27, mutually in-phase digital data Da (=D1, D3, D5, . . .) and Db (=D2, D4, D6, . . .) as shown in FIGS. 3H, 3I are outputted in parallel form at a rate of ½ of the sampling frequency FS.

The digital data Da, Db outputted in parallel form from the data sorting circuit 22 are inputted to a first frequency shift circuit 30.

The first frequency shift circuit 30 multiplies the digital data Da, Db outputted in parallel form from the data sorting circuit 22 and a first local signal C1{cos(−ωt), sin(ωt)} whose frequency is ¼ of the sampling frequency Fs or 0.

Here, for the frequency of the first local signal C1 being Fs/4, ω=2πFs/4=(π/2)Fs and, since t discretely varies at an integral multiple of the period Ts of the sampling signal CKs, it follows that, at an interval 4Ts, cos(-ωt) varies as cos(0)(=1)→cos(-π/2)(=0)→cos(-π)(=-1)→cos(-3π/2)(=0), and sin(-ωt) varies as sin(0)(=0)→sin(-π/2)(=-1)→sin(-π)(=0)→sin (-3π/2)(=1).

Figure 4A:
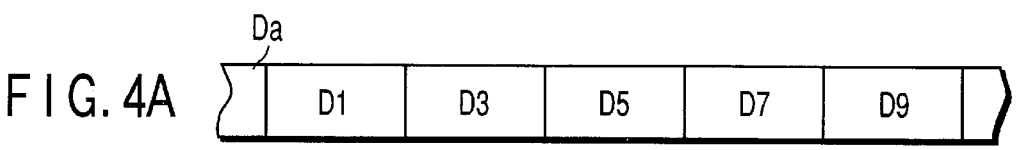
FIGS. 4A to 4D show a timing chart for explaining an operation of the major section of the embodiment shown in FIG. 1.
Figure 4B:
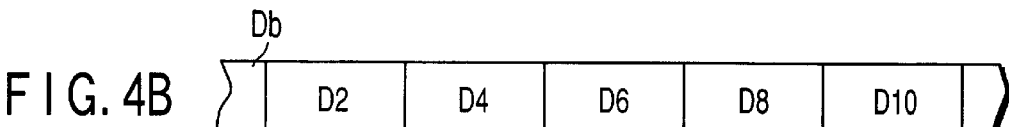
Figure 4C:
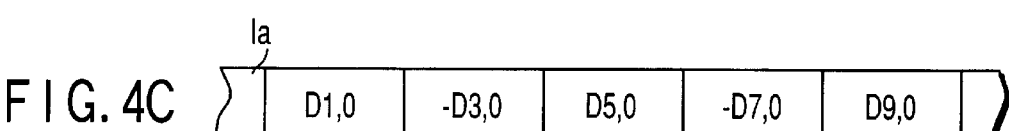
Figure 4D:
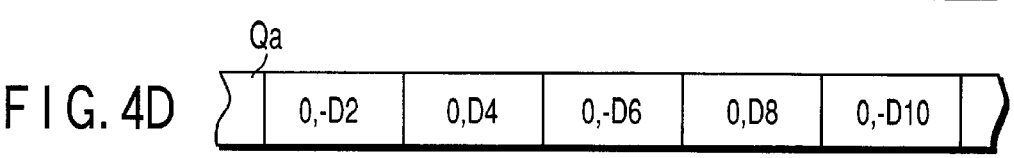

The first frequency shift circuit 30 performs the following multiplying operations of multiplying the above-mentioned first local signal C1 and digital data Da=(D1, D3, D5, D7, . . .) and Db=(D2, D4, D6, D8, . . . , as shown in FIGS. 4A and 4B, inputted in parallel form and generates two quadrature signals Ia, Qa as shown in FIGS. 4D and 4E.

$$Ia = \{D(1) \cdot \cos(0),$$
$$D(2) \cdot \cos(-\pi 2),$$
$$D(3) \cdot \cos(-\pi),$$
$$D(4) \cdot \cos(-3\pi/2),$$
$$D(5) \cdot \cos(0),$$
$$D(6) \cdot \cos(-\pi/2),$$
$$D(7) \cdot \cos(-\pi),$$
$$D(8) \cdot \cos(-3\pi/2)$$
$$\ldots \}$$
$$= (D1, 0, -3D, 0, D5, 0, -D7, 0, \ldots)$$

$$Q2 = (D(1) \cdot \sin(0),$$
$$D(2) \cdot \sin(-\pi/2),$$
$$D(3) \cdot \sin(-\pi),$$
$$D(4) \cdot \sin(-3\pi/2),$$
$$D(5) \cdot \sin(0),$$
$$D(6) \cdot \sin(-\pi/2),$$
$$D(7) \cdot \sin(-\pi),$$
$$D(8) \cdot \sin(-3\pi/2)$$
$$\ldots \}$$
$$= (0, -D2, 0, D4, 0, -D6, 0, D8, \ldots)$$

It is to be noted that the first frequency shift circuit 30 outputs the quadrature signals Ia (D1, 0), Qa (0, D2) corresponding to the parallel-inputted two digital data (for example, D1, D2) at the same rate as that of the digital data Da, Db.

Figure 5A:
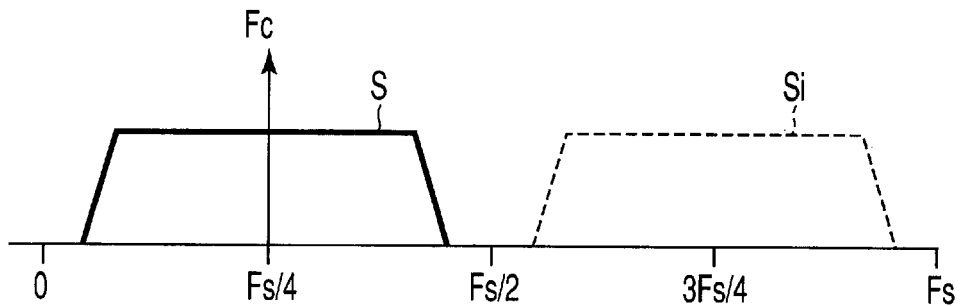
FIGS. 5A and 5B are spectrum diagrams for explaining the operation of the embodiment shown in FIG. 1.

If the quadrature signal component is expressed by the spectrum, it follows that, when the band center Fc of a signal S for example is situated at Fs/4 as shown in FIG. 5A, a corresponding image Si is generated by the A/D conversion processing with a frequency Fs–Fc (=3Fs/4) as a center.

Figure 5B:
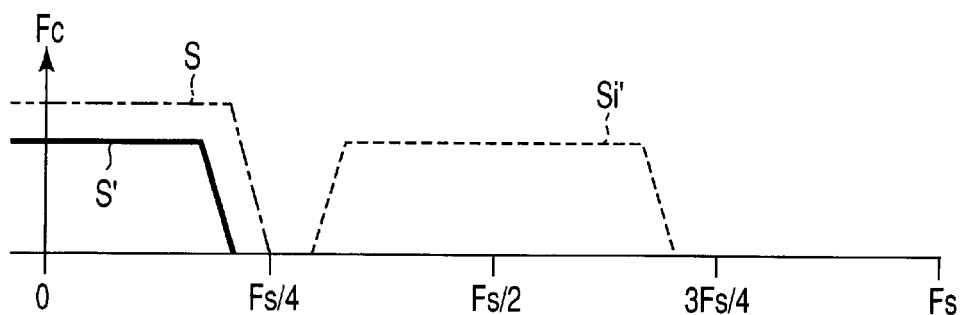

If, as set out above, the multiplying of the digital data and the first local signal C1 of the frequency Fs/4 is performed, then both the signal S and its image Si are shifted by Fs/4 to lower positions as S', Si as shown in FIG. 5B.

At this time, the band center of the signal S' is situated at 0 (baseband) and the band center of the image Si' is matched to Fs/2.

Further, if the frequency of the first local signal C1 is 0, it follows that, since cos(-ωt)=1, sin(-ωt)=0, Ia=(D1, D2, D3, D4, D5, . . .), Qa=(0, 0, 0, . . .).

And the inputted digital data Da, Db are outputted straight as one quadrature signal Ia two in parallel form and the other quadrature signal is always 0.

That is, setting the frequency of the first local signal C1 of the first frequency shift circuit 30 to zero is equivalent to outputting the digital data Da, Db as quadrature signals from the data sorting means 22 without being subjected to any work process.

The frequency (Fs/4 or 0) of the first local signal C1 is switchingly controlled by a later-described controller 40.

Therefore the frequency switching of the first local signal by the controller 40 means inputting the quadrature signals obtained by shifting the digital data Da, Db outputted from the data sorting circuit 22 toward a lowband side by Fs/4 and the digital data Da, Db outputted from the data sorting circuit 22 switchingly to later-described ½ decimating circuits 31, 32.

It is to be noted that the first local signal C1 of the first frequency shift circuit 30 is any of 0, 1 or −1 and that consecutive two sampling data are inputted in parallel form at ½ of the sampling rate and that it is only necessary to, while the data are inputted, perform multiplying operation on the two data, so that the operation speed of the A/D converter 21 is never sacrificed.

The quadrature signals Ia, Qa outputted from the first frequency shift circuit 30 are inputted to the ½ decimating circuits 31, 32.

Here, the term "decimating" is intended to means "partly cut" processing and ½ decimating processing means the processing for reducing, relative to the input data, the output data rate to ½.

The two ½ decimating circuits 31, 32 are comprised of a two-input parallel processing type FIR (Finite Impulse Response) digital filter (a lowpass filter, such as a half band filter manufactured by Harris Co. Ltd.).

The two ½ decimating circuits 31, 32 have a low passband characteristic P with a 0 to Fs/4 passband range as shown in FIG. 5B so as to allow an image component to be eliminated from the quadrature signals Ia, Qa frequency-shifted by the first frequency shift circuit 30.

For this reason, the quadrature signals Ib, Qb whose upper limit frequencies are bandpass limited to Fs/4 are outputted from the ½ decimating circuits 31, 32.

The individual rates of the quadrature signals Ib, Qb outputted from the ½ decimating circuits 31, 32 are ¼ of the sampling frequency Fs and these signals are outputted in parallel form, so that the substantial rate of both combined together becomes ½ of the sampling frequency Fs.

The quadrature signals Ib, Qb outputted from the two ½ decimating circuits 31, 32 are inputted to a second frequency shift circuit 33.

The second frequency shift circuit 33 complex multiplies the quadrature signals Ib, Qb and second local signal C2 of a frequency Δf or frequency 0 set from the controller 40 as follows:

$$(Ib+jQb) \cdot C2 = (Ib+jQb)\{\cos(\pm\omega't) + j\sin(\pm\omega't)\} = Ib \cdot \cos(\pm\omega't) - Qb \cdot \sin(\pm\omega'-t) + j\{Ib \cdot \sin(\pm\omega't) + Qb \cdot \cos(\pm\omega't)\}$$

The real and imaginary parts as a result of complex multiplication are outputted as two quadrature signals Ic, Qc as given below.

$$Ic = Ib \cdot \cos(\pm\omega') - Qb \cdot \sin(\pm\omega't)$$

$$Qc = Ib \cdot \sin(\pm\omega't) + Qb \cdot \cos(\pm\omega't)$$

Here, ω'=2πΔf and ± signs before ω' mean that the sign is − if the inputted quadrature signal is shifted by Δf toward a lowband side and the sign is + if toward a highband side.

In this way, by multiplying the quadrature signals Ib, Qb by the second local signal C2 of a frequency Δf it is possible to shift the inputted quadrature signals, by Δf, toward lowband side or a highband side as in the above case.

In the case where the frequency of the second local signal C2 is set to 0, it follows that, since cos(±ωt)=1 and Si−n (±ωt)=0, Ic=Ib Qc=Qb and the inputted quadrature signals Ib, Qb are outputted directly as the quadrature signals Ic, Qc.

Therefore, setting the frequency of the second local signal C2 to 0 is equivalent to outputting the inputted quadrature signals Ib, Qb simply as the quadrature signals Ic, Qc without the actual multiplication by the local signal.

The frequency of the second local signal C2 of the second frequency shift circuit 33 is switchingly controlled by the later-described controller 40.

The quadrature signals Ic, Qc outputted from the second frequency shift circuit 33 are inputted to 1/N decimating circuits 34, 35.

The 1/N decimating circuits 34, 35 are comprised of narrowband digital filters for extracting baseband quadrature signals Id, Qd from the quadrature signals Ic, Qc.

The narrowband digital filter can be comprised of an FIR type digital filter as in the above-mentioned ½ decimating circuits 31, 32.

In that case, many more filter factors are involved, thus resulting in a complicated structure. In a normal application, use is made of a CIC (Cascaded Integrator Comb) type digital filter (for example, HSP43220, etc., manufactured by Harris Co. Ltd. (Intersil Co. Ltd.))

Figure 6:
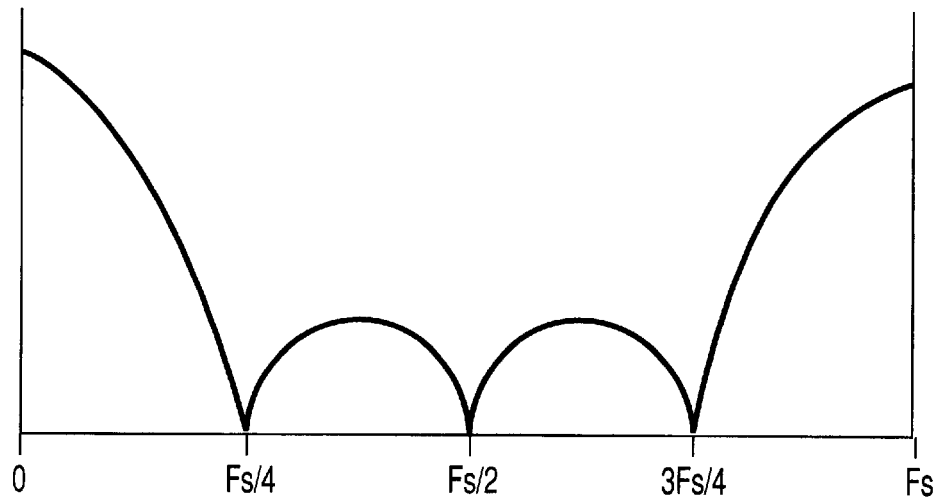
FIG. 6 is a characteristic diagram relating to a major section of the embodiment shown in FIG. 1.

This CIC type digital filter has a characteristic such that, by combining together an integrating type filter (for example, a 1/sinx type) and differentiating type filter (for example, a sinx type) having a periodic function passband characteristic, the attenuation amount is infinity with a frequency (attenuation pole) equally dividing (in FIG. 6, quadrisecting) an interval of 0 to Fs as shown in FIG. 6.

And the frequency of the attenuation pole of this CIC type digital filter emerges at an Fs/N internal, if the frequency ratio (hereinafter referred to as the factor) of both the filters is given by N (in FIG. 4), and, at both ends (0, Fs), the attenuation amount is minimal.

By setting the factor N of the CIC type digital filter in accordance with an analyzing band width it is possible to extract the quadrature signals Id, Qd of the baseband from the quadrature signals Ic, Qc.

The quadrature signals of the first frequency shift circuit 30, second frequency shift circuit 33 and 1/N decimating circuits 34, 35 are inputted to a signal select circuit 36.

This signal select circuit 36 selects, under the control of the controller 40, the quadrature signals converted to the baseband and outputs them to a DSP (digital signal processor, for example, ADSP21062, etc., manufactured by ANALOG DEVICES CO. INC.) as a calculation processing means.

This DSP 37 performs calculation processing on the quadrature signal of the baseband outputted from the signal select circuit 36 to calculate the characteristic values of the inputted analog signal S and outputs them to an output apparatus, not shown.

The controller 40 controls the first frequency shift circuit 30, second frequency shift circuit 33, 1/N decimating circuits 34, 35 and signal select circuit 36 on the basis of information designated from an analyzing condition designating means 51.

As shown in FIGS. 5A and 5B, for example, if broadband processing is designated under an analyzing condition that the center frequency Fc of an analyzing band with respect to the input signal S is maximal with ¼ of the sampling frequency, the frequency of the first local signal C1 of the first frequency shift circuit 30 is set to −Fs/4 and the frequency of the local signal C2 of the second frequency shift circuit 33 is set to 0 and the outputs Ic, Qc of the second frequency shift circuit 33 are selected by the signal select circuit 36.

In such a state, an inputted signal S, being sampled with a sampling signal of a frequency Fs, is converted by the A/D converter 21 to digital data and the digital data are inputted through the data sorting circuit 22 to the first frequency shift circuit 30.

The digital data Da, Db inputted to the first frequency shift circuit 30 are subjected to Fs/4 frequency shifting toward a lowband side. The thus shifted quadrature signals Ia, Qa are subjected by the ½ decimating circuits 31, 32 to filtering processing to obtain the quadrature signals Ib, Qb of the baseband.

The quadrature signals Ib, Qb of the baseband are inputted to the second frequency shift circuit 33 and, since the frequency of the local signal of the second frequency shift circuit 33 is set to 0, the same quadrature signals Ic, Qc as the inputted quadrature signals Ib, Qb are inputted straight through the signal select circuit 36 to the DSP 37 and broadband signal calculation processing is applied to the inputted analog signal S and the corresponding characteristic values are calculated.

Figure 7A:
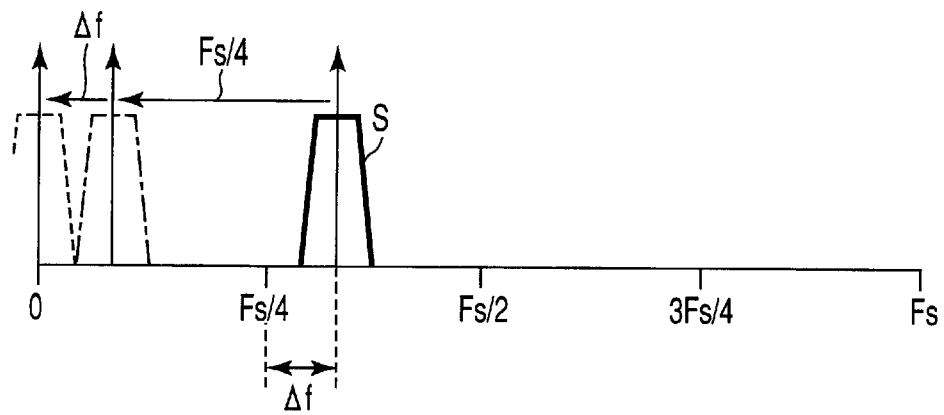
FIGS. 7A and 7B are spectrum diagrams for explaining the operation of the embodiment shown in FIG. 1.

In the case where, as shown in FIG. 7A, under an analyzing condition that the center frequency Fc of the analyzing band is set to be higher than ¼ the sampling frequency by Δf, narrowband analysis is designated with the band width of Fw, the controller 40 sets the frequency of the first local signal C1 of the first frequency shift circuit 30 to −Fs/4, sets the frequency of the second local signal C2 of the second frequency shift circuit 33 to −Δf and sets the factor N corresponding to the band width Fw to the 1/N decimating circuits 34, 35 and allows the outputs Id, Qd of the I/N decimating circuits 34, 35 to be selected by the signal select circuit 36.

In such set state, a signal S of a band center (Fs/4)+Δf, while being sampled with a frequency Fs, is converted by the A/D converter 21 to digital data and the digital data is inputted through the data sorting circuit 22 to the first frequency shift circuit 30.

The digital data Da, Db inputted to the first frequency shift circuit 30 are subjected to Fs/4 frequency shifting toward a lowband side and the thus shifted quadrature signals Ia, Qa are subjected by the ½ decimating circuits 31, 32 to filtering processing to provide quadrature signals Ib, Qb containing a signal whose band center is Δf.

The quadrature signals Ib, Qb are inputted to the second frequency shift circuit 33 and, since these signals are subjected to Δf frequency shifting toward a lowband side, the second frequency shift circuit 33 outputs quadrature signals Ic, Qc containing baseband components.

The baseband component-containing quadrature signals Ic, Qc are subjected by the 1/N decimating circuits 34, 35 to filtering processing to extract baseband quadrature signals Id, Qd.

Figure 7B:
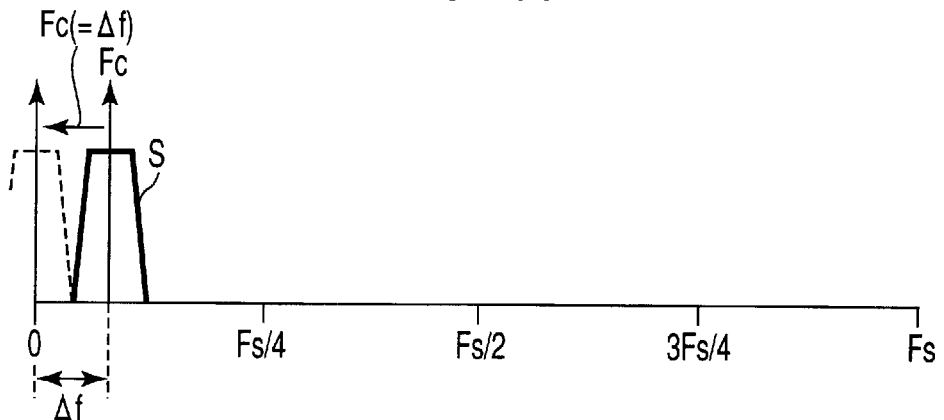
Figure 9:
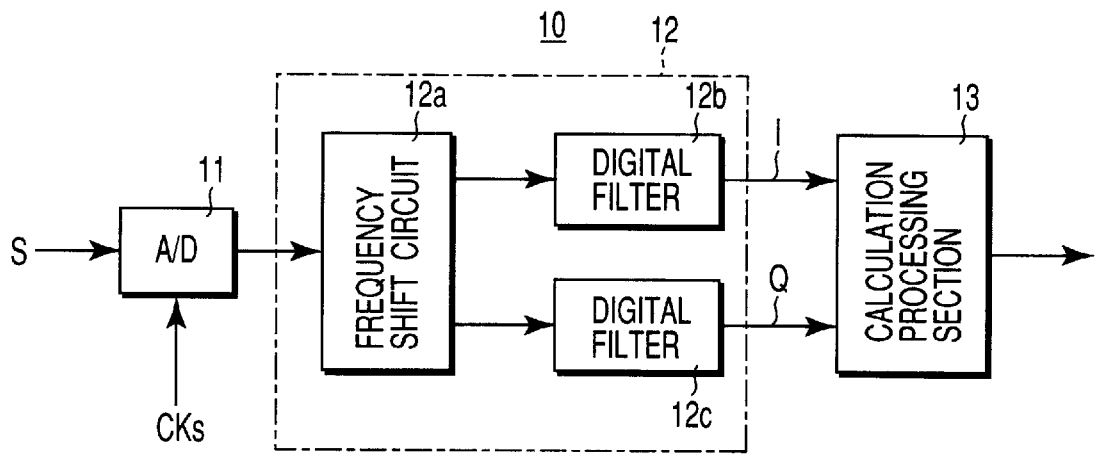
FIG. 9 is a block diagram showing a schematic arrangement of a conventional signal analyzing apparatus.

These baseband quadrature signals Id, Qd are inputted through the signal select circuit 36 to the DSP 37 and narrowband signal calculation processing is applied to the inputted analog signal S to calculate corresponding characteristic values. when narrowband (band width Fw) analysis is designated by the analyzing condition designating means 41 with a center frequency Fc of an analyzing band set to be lower than Fs/4 and displaced by $\Delta f$ from 0 as shown in FIG. 7B, the controller 40 sets the frequency of the first local signal C1 of the first frequency shift circuit 30 to be 0, sets the frequency of the second local signal C2 of the second frequency shift circuit 33 to be $-\Delta f$, and sets the factor N corresponding to the band width Fw to the 1/N decimating circuits 34, 35 and allows the outputs Id, Qd of the 1/N decimating circuits 34, 35 to be selected by the signal select circuit 36.

In such set state, a signal S of a band center $\Delta f$, being sampled with a sampling signal of a frequency Fs, is converted by the A/D converter 21 to digital data and the digital data are inputted through the data sorting circuit 22 to the first frequency shift circuit 30.

The digital data Da, Db inputted to the first frequency shift circuit 30 are handled, without the shift processing, as quadrature signals Ia, Qa (provided that the Qa side is 0) and these signals are subjected by the ½ decimating circuits 31, 32 to filtering processing to provide quadrature signals Ib, Qb (provided that the Qb side is 0) containing a signal whose band center is $\Delta f$.

The quadrature signals Ib, Qb are inputted to the second frequency shift circuit 33 and, since these are $\Delta f$ frequency shifted toward a lowband side, the second frequency shift circuit 33 outputs quadrature signals Ic, Qc containing baseband components.

The baseband component-containing quadrature signals Ic, Qc are subjected by the 1/N decimating circuits 34, 35 to filtering processing to extract baseband quadrature signals Id, Qd.

The baseband quadrature signals Id, Qd are inputted through the signal select circuit 36 to the DSP and narrowband signal calculation processing are applied to the inputted analog signal S to calculate the corresponding characteristic values.

In the case where broadband analysis is designated with the input signal S as a baseband component as an analyzing condition, the controller 40 sets the frequency of the first control signal C1 of the first frequency shift circuit 30 and allows outputs Ia, Qa of the fist frequency shift circuit 30 to be selected by the signal select circuit 36.

In this state, a signal S, being sampled with a sampling signal of a frequency Fs, is converted by the A/D converter 21 to digital data and the data are inputted through the data sorting circuit 22 to the first frequency shift circuit 30 and, since the frequency of a local signal of the first frequency shift circuit 30 is set to 0, the same signal Ia as the inputted digital data Da, Db is inputted, as a baseband component, straight through the signal select circuit 36 to the DSP 37 and a corresponding characteristic value is calculated.

In the case where, though being not shown, narrowband analysis is designated with a center frequency Fc of an analyzing band as an analyzing condition set to be lower then ¼ the sampling frequency by $\Delta f$ and band width of Fw, the controller 40 sets the frequency of a first local signal C1 of the first frequency shift circuit 30 to $-Fs/4$, sets a frequency of a second local signal C2 of the second frequency shift circuit 33 to $+\Delta f$ and sets a factor N corresponding to the frequency band Fw to 1/N decimating circuits 34, 35 and allows the outputs Id, Qd of the 1/N decimating circuits 34, 35 to be selected by the signal select circuit 36.

IN such a state, a signal S of a band center (Fs/4) $-\Delta f$, being sampled with a sampling signal of a frequency Fs, is converted by the A/D converter 21 to digital data and the data are inputted through the data sorting circuit 22 to the first frequency shift circuit 30.

The digital data Da, Db inputted to the first frequency shift circuit 30 are subjected to Fs/4 frequency shifting toward a lowerband side and the shifted quadrature signals Ia, Qa are subjected by the ½ decimating circuits 31, 32 4o filtering processing to provide quadrature signals Ib, Qb containing a signal whose band center is $-\Delta f$.

Since the quadrature signals Ib, Qb are inputted to the second frequency shift circuit 33 and subjected to $\Delta f$ frequency shifting toward a highband side, the second frequency shift circuit 33 outputs quadrature signals Ic, Qc containing baseband components and these signals are subjected by the 1/N decimating circuits 34, 35 to filtering processing to extract baseband quadrature signals Id, Qd.

The baseband quadrature signals Id, Qd are inputted through the signal select circuit 36 to the DSP 37 and narrowband signal calculation processing is performed on the inputted analog signal S to calculate the corresponding characteristic values.

Here, baseband digital data Da, Db outputted from the data sorting circuit 22 are outputted to the signal select circuit 36 through the first frequency shift circuit 30 with the frequency of a first local signal C1 set to 0 and baseband quadrature signals Ib, Qb outputted from the ½ decimating circuits 31, 32 are outputted to the signal select circuit 36 through the second frequency shift circuit 33 with the frequency of a second local signal C2 set to 0.

Therefore, if the output of the data sorting circuit 22 is the baseband, it may be possible to output the baseband digital data Da, Db directly to the signal select circuit 36.

Further, if the outputs of the ½ decimating circuits 31, 32 are basebands, it may be possible to output the quadrature outputs Ib, Qb of the baseband directly to the signal select circuit 36.

Here, it is to be noted that the digital data Da, Db of the baseband outputted from the data sorting circuit 22 are outputted to the signal select circuit 36 through the first frequency shift circuit 30 with the frequency of a first local signal C1 set to 0 and the baseband quadrature signals Ib, Qb outputted from the ½ decimating circuits 31, 32 are outputted to the signal select circuit 36 through the second frequency shift circuit 33 with the frequency of a second local signal C2 set to 0.

In the case where, therefore, the outputs of the data sorting circuit 22 are basebands, it may be possible to output the baseband digital data Da, Db directly to the signal select circuit 36.

In the case where the outputs of the ½ decimating circuits 31, 32 are the basebands, it may be possible to output the baseband quadrature signals Ib, Qb directly to the signal select circuit 36.

In the case where the outputs of the data sorting circuit 22 are in the neighborhood of the baseband, it may be possible to input the digital data Da, Db directly to the ½ decimating circuits 31, 32 without passing through the first frequency shift circuit 30 and to do so with the use of switches, etc.

In this case, it may be possible to fix a local frequency of the first frequency shift circuit 30 to Fs/4 and the controller 40 may input the digital data Da, Db directly to the ½ decimating circuits 31, 32 under switching control of the switches in place of the switching of this local frequency.

In this way, the signal analyzing apparatus 20 of the present embodiment includes the data sorting circuit 22 for sorting digital data which are outputted from the A/D converter 21 into two paths and outputting them in parallel form at a ½ sampling frequency rate; the first frequency shift circuit 30 for ¼ shifting the sampling frequency Fs relative to digital data outputted from the data sorting circuit 22; the ½ decimating circuits 31, 32 for ½ decimating the digital data outputted from the data sorting circuit or outputs of the first frequency shift circuit 30; the second frequency shift circuit 33 for performing pre-set frequency shift processing on outputs of the ½ decimating circuits 31, 32; the 1/N decimating circuits 34, 35 for 1/N decimating outputs of the second frequency shift circuit 33; and the controller 40 for designating input signals to the ½ decimating circuits 31, 32, controlling the shift frequency of the second frequency shift circuit 33 and factor of the 1/N decimating circuits 34, 35 in accordance with an analyzing band width and its band center frequency and outputting baseband components of the input signal S.

For this reason it is possible to, without sacrificing the high-speed characteristic of the A/D converter, analyze various kinds of analog signals of different band widths and band centers, including a broadband signal such as a digital modulation signal of a W-CDMA system.

Further, the shift frequency of the first frequency shift circuit 30 may be subjected to 0 or Fs/4 switching or fixed to the Fs/4 and the width of the shift frequency of the second frequency shift circuit 33 has only to be set to a range of 0 to ±Fs/4, thus ensuring a high-speed operation.

Since the 1/N decimating circuits 34, 35 are comprised of CIC type digital filters, it is only necessary to change the frequency ratio of the filters with respect to the set factor N and the calculation processing can be much simpler than with the use of the FIR type digital filter.

Further, by setting the frequency of the first local signal C1 of the first frequency shift circuit 30 to 0 as in this embodiment, the digital data from the data sorting circuit 22 are inputted straight to the ½ decimating circuits 31, 32 and, by setting the frequency of the second local signal C2 of the second frequency shift circuit 33 to 0, the signals of the ½ decimating circuits 31, 32 are inputted straight to the 1/N decimating circuits 34, 35, so that it is not necessary to make the signal path branched. As a result, a simpler structure can advantageously be obtained.

Figure 8:
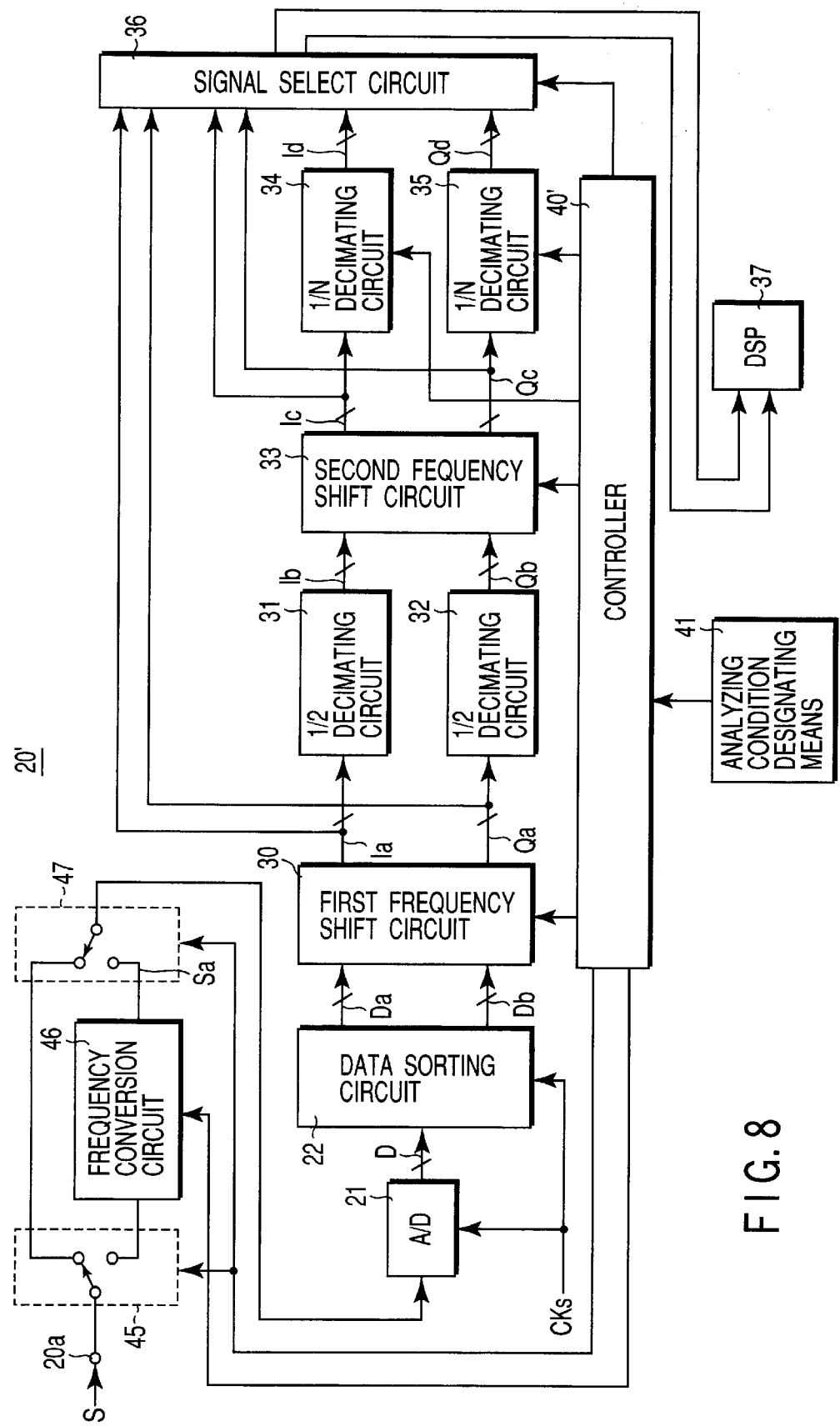
FIG. 8 is a block diagram showing a signal analyzing apparatus according to another embodiment of the present invention, the apparatus having a frequency convention circuit.

Although, in the above-mentioned embodiment, the analog signal S as an analyzing object has been explained as being inputted directly to the A/D converter 21, a switch 45, frequency conversion circuit 46 and switch 47 may be provided between an input terminal 20a and an A/D converter 21 as in a signal analyzing apparatus 20' shown in FIG. 8 and a controller 40' may effect a switching between a mode in which an analog signal S as an analyzing object is inputted by switches 45, 47 directly to the A/D converter 21 and a mode in which a high frequency analog signal S as an analyzing object is input from the switch 45 to the frequency conversion circuit 46 to convert it to an intermediate frequency band and this converted signal Sa is inputted to the A/D converter 21 through the switch 47.

In this case, the controller 40' switchingly controls the frequency of a local oscillation signal of the frequency conversion circuit 46 and an intermediate filter, etc., sets the band center and band width of the output signal Sa, and controls the frequencies of first and second local signals C1 and C2 and factor N of 1/N decimating circuits 34, 35 in accordance with the band center and band width to allow baseband components to be extracted as in the same way as set out above.

In the present invention, by the use of the above-mentioned two ½ decimating circuits 31, 32 it is possible to use, as a digital signal processor (DSP) 37 constituting a calculating means, two ½ decimating circuits 31, 32 and second frequency shift circuit 33, commercially available products having an operation frequency of below 64 MHz but above 64 MHz/2, for example, having an operation frequency of 50 MHz.

As explained above, the signal analyzing apparatus of the present invention includes a data sorting circuit for sorting digital data which are outputted from the A/D converter into two paths and outputting them in parallel form at a ½ sampling frequency rate, a first frequency shift circuit for ¼ shifting the sampling frequency Fs relative to the digital data outputted from the data sorting circuit, ½ decimating circuits for performing ½ decimating processing on any of the output signal of the data sorting circuit or the frequency shifted signal of the first frequency shift circuit, a second frequency shift circuit for performing pre-set frequency shift processing on the output of the ½ decimating circuit, 1/N decimating circuits for performing 1/N decimating processing on the output of the second frequency shift circuit, and a controller for designating input signals to the ½ decimating circuits and controlling the shift frequency of the second frequency shift circuit and factor of the 1/N decimating circuits in accordance with an analyzing band width and band center frequency to allow the outputting of baseband components of the input signal.

It is, therefore, possible to, without sacrificing a high-speed characteristic of the A/D converter, analyze various kinds of analog signals of different band widths and band centers, including a broadband signal such as a digital modulation signal of a W-CDMA system. Further, by setting the frequency of the first local signal of the first frequency shift circuit to 0, the signal analyzing apparatus of the present invention enables the digital data from the data sorting circuit to be inputted straight to the ½ decimating circuits through the first frequency shift circuit, so that it is not necessary to effect the branching of the signal paths involved. It is, therefore, possible to advantageously simplify a structure involved.

As set out above, therefore, the present invention solves the prior art problem and provides a signal analyzing apparatus capable of, without sacrificing the high-speed characteristic of the A/D converter, analyzing various kinds of analog signals of different band widths and band centers, including a broadband signal such as a digital modulation signal, etc. of a W-CDMA system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal analyzing apparatus comprising:
   an analog/digital (A/D) converter for converting a to-be-measured analog signal to digital data while being sampled with a predetermined sampling frequency;
   a data sorting circuit for sorting the digital data which is outputted from the A/D converter alternately into two signal paths and outputting two digital data each having a ½ rate of the sampling frequency in parallel form;
   a first frequency shift circuit for multiplying the two digital data which are outputted in parallel form from the data sorting circuit by a first local signal whose local frequency is set to ¼ of the sampling frequency to shift a band center frequency of the digital data signal by ¼ of the sampling frequency toward a lowband side and generating corresponding two quadrature signals;

two ½ decimating circuits for receiving the two quadrature signals outputted from the first frequency shift circuit, performing band limitation processing with ¼ of the sampling frequency as an upper limit and generating two quadrature signals whose rates are reduced to ½ relative to input signals;

a second frequency shift circuit for multiplying the two quadrature signals which are outputted from the two ½ decimating circuit by a second local signal of a pre-set local frequency to shift the band center frequency to a lowband side and outputting corresponding two quadrature signals with the band center frequency set to zero;

a controller for setting the second local frequency so as to obtain baseband components of the to-be-measured analog signal as outputs from the second frequency shift circuit; and calculating means for calculating characteristic values of the to-be-measured analog signal by performing calculation processing on the baseband components on the basis from the outputs from the second frequency shift circuit.

2. A signal analyzing apparatus according to claim 1, wherein the A/D converter operates with a sampling signal having a frequency of not less than double the band width (20 MHz) of a digital modulation signal of a W-CDMA system.

3. A signal analyzing apparatus according to claim 2, wherein the frequency of the sampling signal is 64 MHz.

4. A signal analyzing apparatus according to claim 2, wherein the data sorting circuit sorts the digital data which is outputted from the A/D converter alternately into two signal paths in synchronism with the sampling signal and outputs the data in parallel form in an in-phase state at a ½ rate of the sampling frequency Fs.

5. A signal analyzing apparatus according to claim 4, wherein the data sorting circuit comprises two first latch circuits for receiving digital data outputted from the A/D converter; a frequency divider for frequency dividing the sampling signal into two signals and supplying two frequency division signals CK1, CK2 to the two first latch circuits to latch the digital data, the two frequency division signals CK1, CK2 having their leading edge phases inverted in synchronism with the trailing edge of the sampling signal; two second latch circuits for receiving latch outputs from the two first latch circuits; and a third latch circuit for supplying a common clock signal to the two second latch circuits, wherein the third latch circuit latches the frequency division signal CK2 in response to a leading edge of the sampling signal and generates the common clock signal obtained by delaying the frequency division signal CK2 at ½ of a period Ts of the sampling signal.

6. A signal analyzing apparatus according to claim 1, wherein the two ½ decimating circuits are comprised of a two-input parallel processing type FIR (Finite Impulse Response) digital filter.

7. A signal analyzing apparatus according to claim 3, wherein a digital signal processor (DSP) constituting the calculating means, two ½ decimating circuits and second frequency shift circuit have a high operation frequency of below 64 MHz but above 64 MHz/2.

8. A signal analyzing apparatus according to claim 1, further comprising two 1/N decimating circuits comprised of narrowband digital filters for extracting baseband quadrature signals Id, Qd from the quadrature signals Ic, Qc inputted from the second frequency shift circuit.

9. A signal analyzing apparatus according to claim 8, wherein the two 1/N decimating circuits are comprised of FIR type digital filters or CIC (Cascaded Integrator Comb) type digital filters.

10. A signal analyzing apparatus according to claim 8, further comprising a signal select circuit for receiving these quadrature signals outputted from the first frequency shift circuit, second frequency shift circuit and 1/N decimating circuit; a controller for allowing the quadrature signals converted to the baseband to be selected from the signal select circuit and outputting these to a DSP as the calculating means, and an analyzing condition designating means, wherein the controller controls the first frequency shift circuit, second frequency shift circuit, two 1/N decimating circuit and signal select circuit on the basis of information designated from the analyzing condition designating means.

11. A signal analyzing apparatus according to claim 10, wherein, if, on the basis of the information designated from the analyzing condition designating means, broadband processing is designated on the input signal S under an analyzing condition that the center frequency Fc of an analyzing band is maximal at a ¼ sampling frequency, the frequency of the first local signal C1 of the first frequency shift circuit is set to −Fs/4 and the frequency of the local signal C2 of the second frequency shift circuit is set to 0 and the outputs Ic, Qc of the second frequency shift circuit is selected at the signal select circuit.

12. A signal analyzing apparatus according to claim 1, further comprising a first switch, frequency conversion circuit and second switch which are provided before the A/D converter, wherein the controller effects a switching between a mode in which the analog signal S as an analyzing object is inputted, by the first and second switches, straight to the A/D converter and a mode in which the analog signal S as an analyzing object is inputted from the first switch to the frequency conversion circuit to convert the signal to an intermediate frequency and a converted signal Sa is inputted to the A/D converter through the second switch.

13. A signal analyzing apparatus according to claim 12, wherein the controller switchingly controls the frequency of a local oscillation signal of the frequency conversions circuit, intermediate frequency filter, etc., sets a band center and band width of the output signal Sa, controls the frequencies of the first local signal C1 and second local signal C2 and factor N of the two 1/N decimating circuit in accordance with the band center and band width, and extracts the baseband components.

14. A signal analyzing apparatus comprising:

an A/D converter for converting a to-be-measured analog signal to digital data while being sampled with a predetermined sampling frequency;

a data sorting apparatus for sorting the digital data which is outputted from the A/D converter alternately into two signal paths and outputting two digital data each having a ½ rate of the sampling frequency;

a first frequency shift circuit for multiplying the two digital data which are outputted in parallel form from the data sorting circuit by a first local signal of a local frequency set to zero to shift the band center frequencies of the two digital data to zero and generating corresponding two quadrature signals;

two ½ decimating circuits for receiving the two quadrature signals outputted from the first frequency shift circuit, performing band limitation processing with ¼ of the sampling frequency as an upper limit and generating two quadrature signals whose rates are reduced to ½ relative to input signals;

a second frequency shift circuit for multiplying the two quadrature signals which are outputted from the two ½ decimating circuits by a second local signal of a pre-set local frequency to shift the band center frequency toward a lowband side and generating corresponding two quadrature signals whose band center frequencies are set to zero;

a controller for setting the local frequencies of the first local signal and second local signal so as to obtain baseband components as outputs from the second frequency shift circuit; and calculating means for calculating characteristic values of the to-be-measured analog signal by performing calculation processing on the baseband components on the basis of the outputs from the second frequency shift circuit.

* * * * *